(12) United States Patent
Benson et al.

(10) Patent No.: US 7,475,964 B2
(45) Date of Patent: Jan. 13, 2009

(54) ELECTRICAL CONTACT ENCAPSULATION

(75) Inventors: Brad Benson, Corvallis, OR (US);
Frank J. Bretl, Corvallis, OR (US);
Ellen L. Chappell, Corvallis, OR (US);
M. Jeffery Igelman, Corvallis, OR (US);
Steve H. Zhang, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 446 days.

(21) Appl. No.: 10/913,101

(22) Filed: Aug. 6, 2004

(65) Prior Publication Data

US 2006/0027937 A1    Feb. 9, 2006

(51) Int. Cl.
*B41J 2/14* (2006.01)

(52) U.S. Cl. ....................................................... 347/50

(58) Field of Classification Search ................... 347/50, 347/58, 86; 29/890.01; 257/734, 736, 783, 257/784
See application file for complete search history.

(56) References Cited

U.S. PATENT DOCUMENTS

| | | | |
|---|---|---|---|
| 5,046,953 A | 9/1991 | Shreeve et al. | |
| 5,072,520 A | 12/1991 | Nelson | |
| 5,083,191 A | 1/1992 | Ueda et al. | |
| 5,120,678 A | 6/1992 | Moore et al. | |
| 5,161,093 A | 11/1992 | Gorczyca et al. | |
| 5,277,985 A | 1/1994 | Li et al. | |
| 5,405,807 A | 4/1995 | Baker et al. | |
| 5,439,649 A | 8/1995 | McBride et al. | |
| 5,814,401 A | 9/1998 | Gamota et al. | |
| 5,953,032 A * | 9/1999 | Haarz et al. | 347/87 |
| 5,969,413 A * | 10/1999 | Yano et al. | 257/673 |
| 6,066,512 A * | 5/2000 | Hashimoto | 438/112 |
| 6,305,668 B1 | 10/2001 | Edens | |
| 6,322,200 B1 * | 11/2001 | Feinn et al. | 347/58 |
| 6,325,491 B1 | 12/2001 | Feinn | |
| 6,329,222 B1 * | 12/2001 | Corisis et al. | 438/118 |
| 6,449,831 B1 * | 9/2002 | Komplin et al. | 29/611 |
| 6,626,518 B2 | 9/2003 | Choy | |
| 6,634,732 B2 * | 10/2003 | Farr et al. | 347/29 |
| 6,641,254 B1 | 11/2003 | Boucher et al. | |
| 6,705,693 B2 | 3/2004 | Lim et al. | |
| 6,727,115 B2 | 4/2004 | Van Hoff | |
| 2002/0018102 A1 | 2/2002 | Nozawa | |
| 2003/0138991 A1 | 7/2003 | Kung | |
| 2003/0193545 A1 | 10/2003 | Boucher et al. | |

FOREIGN PATENT DOCUMENTS

| | | |
|---|---|---|
| EP | 0669634 | 12/1998 |
| EP | 0645471 | 12/1999 |
| JP | 62264648 | 11/1987 |

* cited by examiner

*Primary Examiner*—Anh T. N. Vo

(57) ABSTRACT

An electronic device comprises a substrate and an electrical contact in contact with the dielectric layer and electrically coupled with at least one resistor, a substrate carrier including an electrical trace electrically coupled to the electrical contact, a polymer enclosing the electrical contact, and a substantially planar film disposed over the electrical contact.

25 Claims, 13 Drawing Sheets

ELECTRICAL CONTACT ENCAPSULATION

BACKGROUND

The market for electronic devices continually demands increased performance at decreased costs. In order to meet these requirements the components which comprise various electronic devices need to be made more reliable, with more demanding tolerances, decreased sizes, or any combination of these or other factors.

Typically, a semiconductor device includes a semiconductor die with bond pads formed on its surface. The semiconductor die is attached to a lead frame, having a plurality of leads, before bonding. Then, typically, a polymer is dispensed or molded around the die, the leads, and the majority of the lead frame to encapsulate the device. The device is often electrically coupled with a printed circuit board (PCB) by soldering leads of the lead frame to pads on the PCB. The utilization of some encapsulating polymers can lead to performance degradation and damage from electrical shorting, corrosion, or cracking due to moisture. This tends to be an even greater problem when the electronic device must operate in a harsh environment.

Hermetic sealing using a metal or ceramic package provides an increased level of protection. However, the manufacturing process is complex and results in a more expensive package of increased size. Another method that can be utilized is sealing a semiconductor chip's active circuitry at the wafer stage, by applying a passivation coating over the active circuitry on the wafer. However, this process may still lead to a non-hermetically sealed device, by causing damage to the ceramic like coating in the vicinity of the bond pads in subsequent processing, thereby permitting corrosion to deleteriously affect chip reliability and life. Further, this process does not provide protection to the bond pads and electrical interconnections. In addition, these technologies do not lend themselves to all applications. For instance, over the past decade, substantial developments have been made in the micromanipulation of fluids, in fields such as printing technology using inkjet printers. The ability to maintain reliable electrical interconnections in such products has become more difficult as the corrosive nature of the fluids increases.

A fluid ejection device is one type of semiconductor device in which providing robust electrical interconnections to a semiconductor chip operating in a harsh environment is required. There are a wide variety of highly-efficient fluid ejection devices, currently in use, which are capable of dispensing fluid in a rapid and accurate manner. Conventionally, electrical interconnections are made using a flexible circuit that has metal leads that extend out from the flexible substrate and are coupled to bond pads located on the inkjet chip. A polymer encapsulant is dispensed onto the coupled bond pads and beams and is then cured.

In particular, improvements in image quality have led to the use of more complex ink formulations that generally increases the organic content of inkjet inks. The use of such inks, results in a more corrosive environment experienced by the materials coming in contact with these inks. Thus, degradation of the electrical interconnections by these more corrosive inks raises material compatibility issues as well as design issues in order to maintain reliable print heads.

In designing a fluid ejection device, there is a desire to decrease the size of the fluid ejection device, e.g. the size of the silicon die of a print head, increase its reliability, and improving fluid output, e.g. print quality in a print head.

BRIEF DESCRIPTION OF THE DRAWINGS

Features of the invention will readily be appreciated by persons skilled in the art from the following detailed description of exemplary embodiments thereof, as illustrated in the accompanying drawings, in which.

DETAILED DESCRIPTION OF THE DRAWINGS

Figure 1:
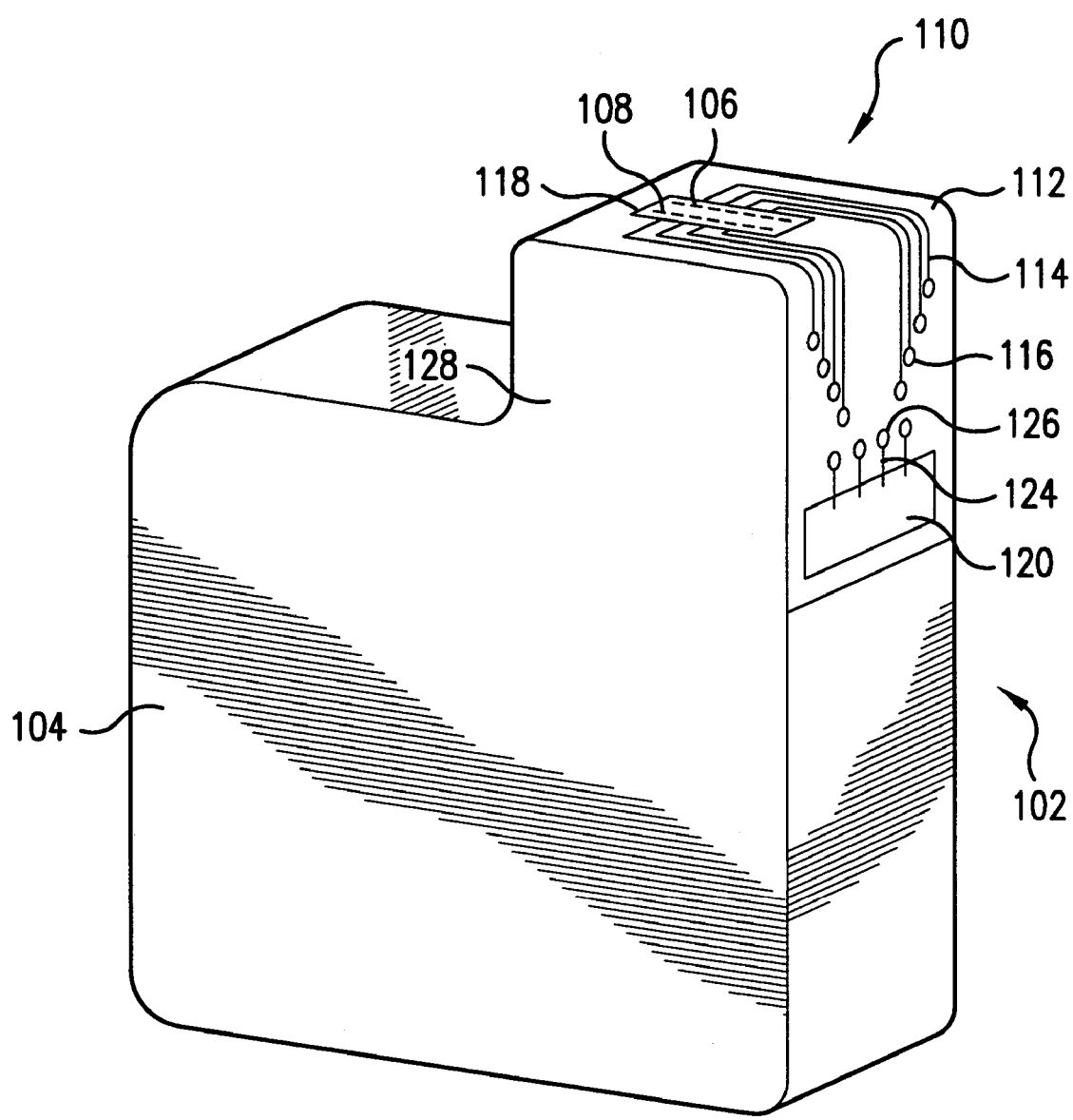
FIG. 1 illustrates a fluid ejection assembly according to one embodiment.

Referring to FIG. 1, an exemplary embodiment of a fluid ejection assembly 102, here depicted as an inkjet cartridge. In this embodiment, fluid ejection assembly 102 includes reservoir 104 that contains a fluid, which is supplied to a substrate (not shown) that is secured to the back of nozzle layer 106. Nozzle layer 106 contains one or more orifices 108 through which fluid is ejected. Fluid ejection device 110 includes the substrate (not shown), nozzle layer 106, and orifices 108. Flexible circuit 112 of the exemplary embodiment is a polymer film and includes electrical traces 114 connected to electrical contacts 116. Electrical traces 114 are routed from electrical contacts 116 to electrical connectors or bond pads on the substrate (not shown) to provide electrical connection for the fluid ejection assembly 102. Encapsulation beads 118 are dispensed along the edge of nozzle layer 106 and the edge of the substrate enclosing the end portion of electrical traces 114 and the bond pads on the substrate.

In certain embodiments, information storage element 120 may be disposed on fluid ejection assembly 102 as shown in FIG. 1. Preferably, information storage element 120 is electrically coupled to flexible circuit 112. Information storage element 120 is any type of memory device suitable for storing and outputting information that may be related to properties or parameters of the fluid or ejector head 110. Preferably, information storage element 120 is a memory chip mounted on flexible circuit 112 and electrically coupled through electrical traces 124 to electrical contacts 126. Alternatively, information storage element 120 can be encapsulated in its own package with corresponding separate electrical traces and contacts. When fluid ejection assembly 102 is either inserted into, or utilized in, a dispensing system information storage element 120 is electrically coupled to a controller that communicates with information storage element 120 to use the information or parameters stored therein. However, other forms of information storage can also be utilized for the information storage element 120, such as a bar code or other device that allows storage of information.

In the fluid ejection assembly depicted in FIG. 1, reservoir 104 may be integrally formed in or located separately from body 128.

Figure 2:
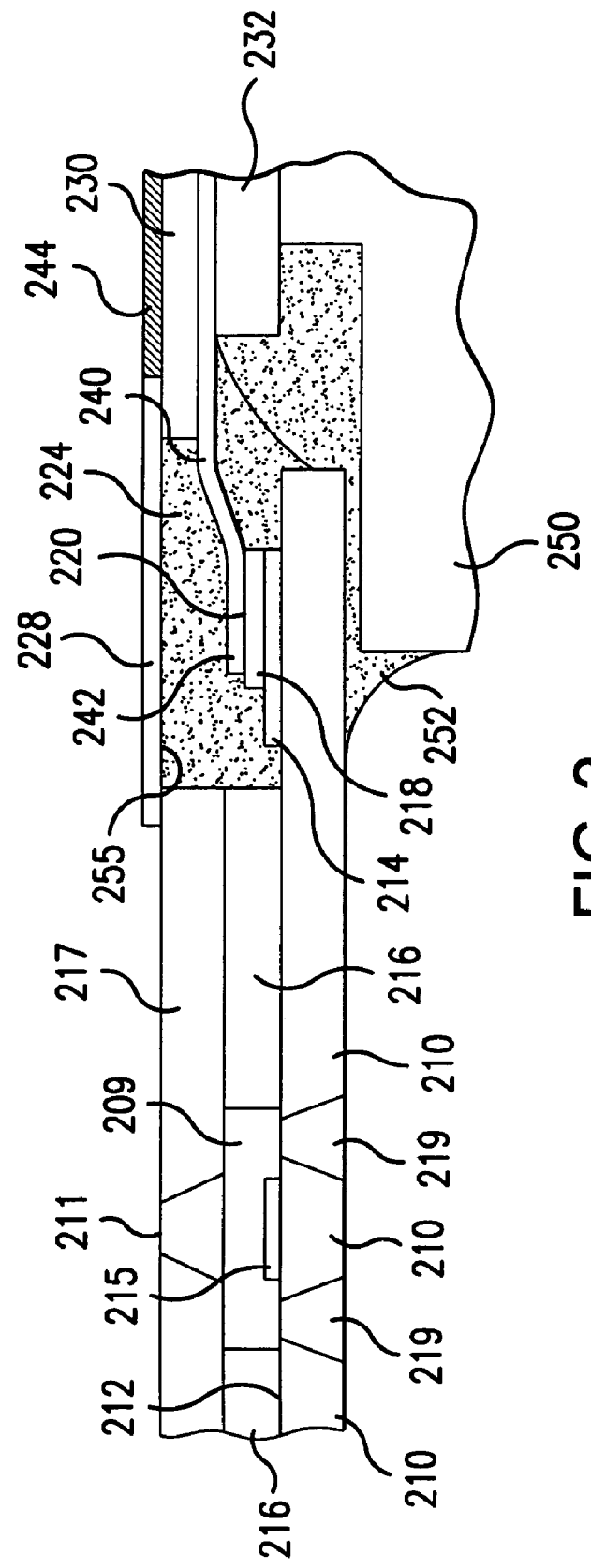
FIG. 2 illustrates a cross-sectional view of a portion of the fluid ejection assembly according to one embodiment.

Referring to FIG. 2, a cross-sectional view of a portion of the fluid ejection assembly according to one embodiment is illustrated. Substrate 210 has fluid ejection element 215 formed on or within surface 212. In one embodiment, fluid ejection element 215 utilizes a resistor that heats ink for ejection, however, other fluid ejection elements may also be utilized such as piezoelectric, flex-tensional, acoustic, and electrostatic. In addition, substrate 210, preferably, includes one or more transistors or other logic devices (not shown) formed on substrate 210, that switch and control ejection by fluid ejection elements 215. However, "direct drive" structures, that do not use transistors or other logic devices, can also be utilized. In a direct drive application each fluid ejector is electrically connected to a bond pad.

Chamber layer 216 forms fluidic chamber 209 of fluid ejection element 215 so that when resistor of the fluid ejection element 215, or another structure, is activated fluid is ejected from nozzle 211, which is generally located adjacent to chamber layer 216. Fluid channels 219 formed in substrate 210 provide a fluidic path for fluid in reservoir 104 shown in FIG. 1 to provide fluid for fluidic chamber 209.

As shown in FIG. 2, nozzle layer 217 is formed over chamber layer 216. Nozzle layer 217 may be formed of metal, polymer, glass, or other suitable material such as ceramic, or combinations thereof. In one embodiment, a photodefinable polymer can be used to form both nozzle layer 217 and chamber layer 216. For example, a photodefinable polyimide, benzocyclobutene, or epoxy can be utilized. In one embodiment, nozzle layer 217 and chamber layer 216 are formed from a photoimagible epoxy available from MicroChem Corp. under the trademark NANO SU-8. Other materials such as polyimides, polyesters, polyethylene naphthalates (PEN), epoxies, or polycarbonates can also be utilized. In addition, nozzle layer 217 can also be formed from a metal such as a nickel base enclosed by a thin gold, palladium, tantalum, or rhodium layer.

It should be noted that in certain embodiments, nozzle layer 217 and chamber layer 216 are formed as integral structure that is only one layer having portions where fluidic chamber 209 and orifice 211 are defined.

Dielectric layer 214 is formed over at least a portion of substrate 210, providing electrical isolation for one or more bond pads 218. Preferably, substrate 210 comprises silicon and may include transistors and other logic devices (not shown) formed therein and/or thereon. However, materials such as germanium, gallium arsenide, amorphous silicon, aluminum oxide, polysilicon, and other materials may also be utilized. Dielectric layer 214 and bond pad 218 may be formed utilizing conventional semiconductor equipment. Dielectric layer 214, preferably, may be a dual layer structure including silicon carbide and silicon nitride, with each layer having a thickness in the range from about 0.05 microns to 2.0 microns. However, other materials such as silicon oxide, silicon nitride, aluminum oxide, or other materials, having other thicknesses may also be utilized depending on the particular application and environmental factors.

In one embodiment, a dual layer structure is utilized for bond pad 218. A first metal layer comprising tantalum having a thickness in the range from about 0.075 microns to about 5.0 microns is deposited over dielectric layer 214. A second metal layer comprising gold having a thickness in the range from about 0.1 microns to about 2.5 microns is deposited over the first metal layer. However, other metals and metal alloys can also be utilized such as aluminum and aluminum alloys. In addition, other thicknesses can also be utilized.

Flexible circuit 232 includes base film 230 and electrical traces 240 as shown in FIG. 2. In one embodiment, base film is formed from a polymer such as polyimide, polyester, or polyethylene naphthalate (PEN) to name a few. Examples of commercially available base film materials include a polyimide film available from E. I. DuPont de Nemours & Co. under the trademark "Kapton" and a polyimide material available from Ube Industries, LTD (of Japan) under the trademark "Upilex" Flexible circuit 232 is formed utilizing techniques well known in the art such as conventional photolithographic etching, metal deposition, metal foil lamination, and electroplating processes. Preferably, flexible circuit 232 is processed in a tape form using reel-to-reel processing equipment.

In one embodiment, electrical trace end 242 and bond pad 218 may be connected utilizing a conventional TAB bonder, such as an inner lead bonder commercially available from Shinkawa Corporation. The bonder applies pressure to electrical trace end 242 pressing trace end 242 onto bond pad 218 through the opening formed between the end of nozzle layer 217 and the end of base film 230. The bonder applies heat, to form a thermal compression bond thereby forming electrical interconnection 220. Other types of bonding can also be utilized, such as ultrasonic bonding, conductive adhesive, solder paste, wire bonding, or other electrical bonding technologies.

To provide mechanical support as well as environmental protection a polymer 224, such as an epoxy, is dispensed so that the dispensed polymer 224 encloses the connection between bond pad 218 and electrical trace end 242. Preferably polymer 224 is epoxy paste dispensed through a needle dispenser and cured via heat or ultraviolet light (UV). However, other materials such as polyimides, benzocyclobutenes, polyacrylates, polynorbornene, polysiloxane, polyurethanes, phenolics, anaerobics, cyanoacrylates, polysulfides, synthetic and natural rubber adhesives can also be utilized. Examples of polymer 224 include, but are not limited to, AHS-735 and AHS-828 commercially available from 3M Inc.

Film 228 is applied over polymer 224. The film can be a single layer or multilayer organic or inorganic, preferably organic thermoplastic or thermoset polymers with barrier coatings. Examples of polymers for the film, include, but are not limited to polyamide, polyimide, polyester, polyolefin, polystyrene, polymethylmethacrylate, polycarbonate, and fluoropolymer such as Teflon. Examples of the barrier coating, include, but are not limited to $SiO_2$ glass, flexible glass $SiO_x$ derived from siloxane monomers, ceramics such as alumina oxides, nitrides, carbides, borides, fluorides and mixtures thereof. Inorganic components such as palladium, gold, tungsten, aluminum, tantalum, chromium, nickel, titanium, copper, alloys of such metals may also be utilized as the barrier coating. In addition, the barrier can be a polymer layer within the film. Examples of such barrier polymers, include, but are not limited to liquid crystal polymer, polyolefin, polyacrylates, polyvynidenedichloride, polyethylenevinylalcohol, polyester, polyimides and polyamides. In certain embodiments, the thickness of film 228 may range from about 5 microns to about 500 microns, preferably about 6 microns to about 200 microns.

In some embodiments, film 228 may include an adhesive formed on surface 255. The adhesive may be utilized to form at least a part of polymer 224 when heat is applied to film 228 to reflow the adhesive. Adhesive materials formed on film 228 may comprise materials such as epoxies, phenolics, acrylics, urethanes, anaerobics, cyanoacrylates, polysulfides, olefins, silicones, flouropolymers, natural and synthetic rubbers, polyimides and polyamides cured via heat, UV, moisture or microwave methods. Examples of the adhesive film, include, but are not limited to an about 50 micron thick epoxy adhesive coated on 25 micron polyimide base film.

Film 228 is applied so that when it is fixed in place over polymer 224, it is substantially planar. The utilization of a substantially planar film allows for a design of fluid ejection device, or any other electrical device within tight tolerances and/or specifications, by having a substantially uniform height or depth of polymer 224 between film 228 and a surface to which the polymer is being applied.

Further, in the case of a fluid ejection device, the use of a substantially planar film over a surface of polymer allows precise spacing between the fluid ejection assembly and the media onto which fluid is being ejected. In addition, the use of a substantially planar film prevents ink, which is wiped from the nozzle area and distributed across the printhead, from building up on the fluid ejection assembly and causing damage to the assembly.

Also, since the length and width of the film may be precisely determined and the film may be precisely positioned onto the assembly the overall size of fluid ejection assembly may be decreased since the spacing between the fluid ejection device and the substrate can be reduced. It is also possible, that the size of fluid ejection device may be reduced since the spacing of nozzles formed on the device and the edge of the device may be reduced due to the reduced likelihood of spillover by polymer, during manufacture, onto the fluid ejection device.

In addition film 228 provides an additional barrier, which can be used to reduce diffusion of gases, fluids, and other contaminants into the portions of the electronic device that can be damaged or have decreased performance due to diffusion.

The adhesion between polymer 224 and film 228 can be adjusted by pretreating the surface of polymer 224 before applying layer 228. For example, either plasma treatment or corona discharge treatment of polymer 224 and film 228 with a reactive gas such as oxygen may be used. However, other surface treatments such as laser, flame, chemical, or combinations thereof can also be utilized. In addition, a coupling agent can also be utilized by either incorporation in polymer 224 and film 228 or by application to the surface of film 228 or to the surface of polymer 224 after dispensing.

Adhesive 252 is dispensed around the periphery of substrate 210 providing both a method of attachment and a fluid seal between substrate 210 and fluid ejection body 250. Preferably adhesive 252 is a thermally cured epoxy, however, other adhesives such as hot melt, silicone, UV curable adhesive, and mixtures thereof can also be utilized. Further, a patterned adhesive film may be positioned on either fluid ejection body 250 or substrate 210, as opposed to dispensing a bead of adhesive.

Coverlayer 244 is heat staked to fluid ejection body 250 providing an adhesive function to attach flexible circuit 232 (shown in FIG. 2) to fluid ejection body 250 as well as providing environmental protection of electrical traces 240. Preferably coverlayer 244 is a three-layer laminate with a 37.5 micron ethyl vinyl acetate (EVA), a 12.5 micron polyethylene terephthalate (PET) layer, and a 37.5 micron ethyl vinyl acetate layer. EVA is a thermoplastic material, which reflows upon heating and bonds to fluid ejection body 250. The PET film acts as a carrier layer that allows mechanical punching and handling of coverlayer 244 without excessive stretching. In some applications a single layer film can also be utilized. The single layer film may comprise a single layer of EVA, polyolefin, or acrylic acid copolymers, amongst others.

It should be noted that in some embodiments, it is possible to create film that has a substantially concave shape when viewed from above the electronic device. In such a case, portion of an outward facing surface of films 228 may be below an outward facing surface of nozzle layer 217. This may be created by a curing process of the adhesive, after apply film 228, which may result from the surface tension of adhesive on the film when the adhesive is partially liquefied during curing.

Figure 3A:
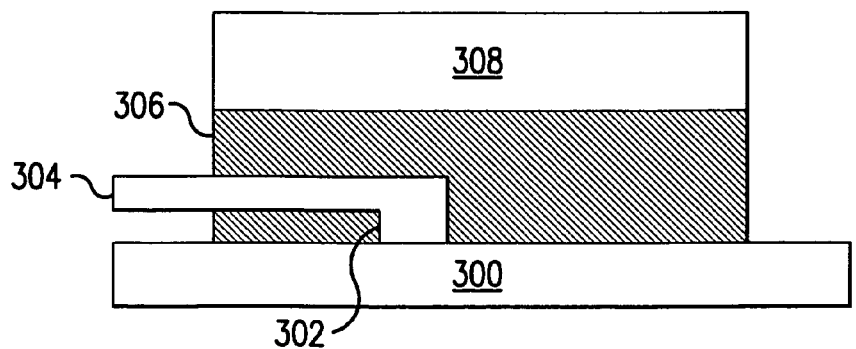
FIG. 3A illustrates an embodiment of a cross-sectional view of a portion of an electronic device.

Referring to FIG. 3A, an embodiment of a cross-sectional view of a portion of an electronic device is illustrated. A contact 302 is formed on or as part of a substrate 300, which may be a bond pad and substrate, respectively. Contact 302 is electrically coupled to a lead 304 which may be coupled to a flexible circuit or other structure. In some embodiments, contact 302 is physically coupled to lead 304, as well as being electrically coupled. A polymer 306, such as a paste adhesive or epoxy, examples of which are described with respect to FIG. 2, is utilized to encapsulate at least a portion of the electrically conductive area between contact 302 and lead 304. The use of polymer 306 provides protection for contact 302 and lead 304 from the external environment and elements which may delaminate the connection between contact 302 and lead 304 or that may cause short circuits or other damage to them.

In certain embodiments, polymer 306 has a thickness in the micron range above the lead 304, and the exact thickness is determined by the desired specifications for the application, e.g. device parameters.

A film 308 that is substantially planar is applied to the surface of polymer 306. Film 308 provides several advantages, including, but not limited to, maintaining a consistent polymer thickness and providing a consistent distance between a surface of a component including the substrate and a surface. Further, the choice of composition for film 308 may provide additional benefits for protecting the electrical connection between contact 302 and lead 304.

Figure 3B:
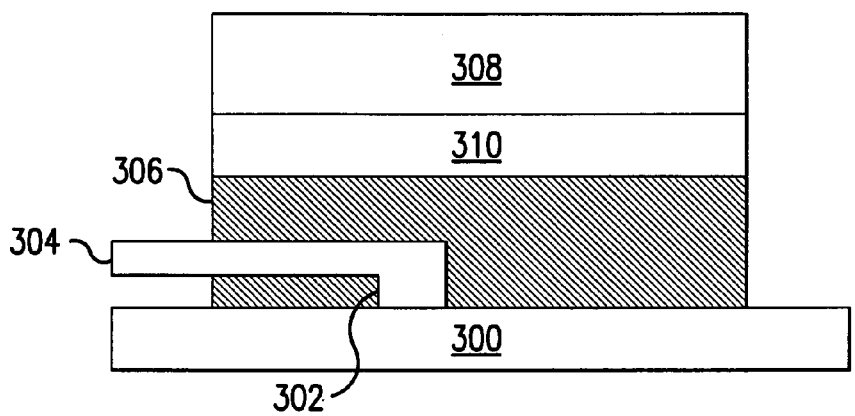
FIG. 3B illustrates another embodiment of a cross-sectional view of a portion of an electronic device.

Referring to FIG. 3B, another embodiment of a cross-sectional view of a portion of an electronic device is illustrated. In the embodiments depicted in FIG. 3B, a barrier layer 310 is interposed between polymer 306 and film 308. Barrier layer 310 provides an additional moisture and/or gas diffusion barrier between polymer 306 and film 308. In addition, barrier layer 310 may improve adhesion between polymer 306 and film 308.

In some embodiments, barrier layer 310 may be a silicon oxide that is deposited onto film 308 prior to the application of film 308 to polymer 306. In other embodiments, barrier layer 310 may be a separate film which may be a multi-layer film and may be applied to the surface of polymer 306 or the surface of film 308 prior to the application of film 308. In additional embodiments, barrier layer 310 may be formed of aluminum oxide, sol gel, a polymer, or liquid crystal polymer. The thickness of barrier layer 310 may be chosen as appropriate for the desired specification of the electronic device, and in certain embodiments may be between approximately 50 angstroms and approximately 5 microns.

In certain embodiments, where the electronic device is a fluid ejection device, a combined thickness of polymer 306, film 308, and barrier layer 310 is approximately 100 microns. However, the combined thickness of polymer 306, film 308, and barrier layer 310 is dependent on the application and design specifications, and may have any desired thickness.

Figure 3C:
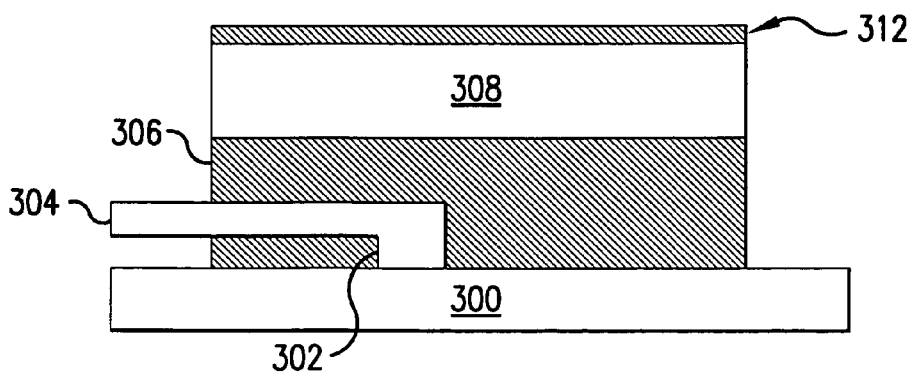
FIG. 3C illustrates an additional embodiment of a cross-sectional view of a portion of an electronic device.

Referring to FIG. 3C, an additional embodiment of a cross-sectional view of a portion of an electronic device is illustrated. In the embodiment depicted in FIG. 3C, a layer 312 is applied to a surface of film 308 that opposes a surface of film 308 that is in contact with polymer 306. The layer 312 can be a barrier layer or a paste adhesive to provide extra protection of the bonded traces.

Figure 4:
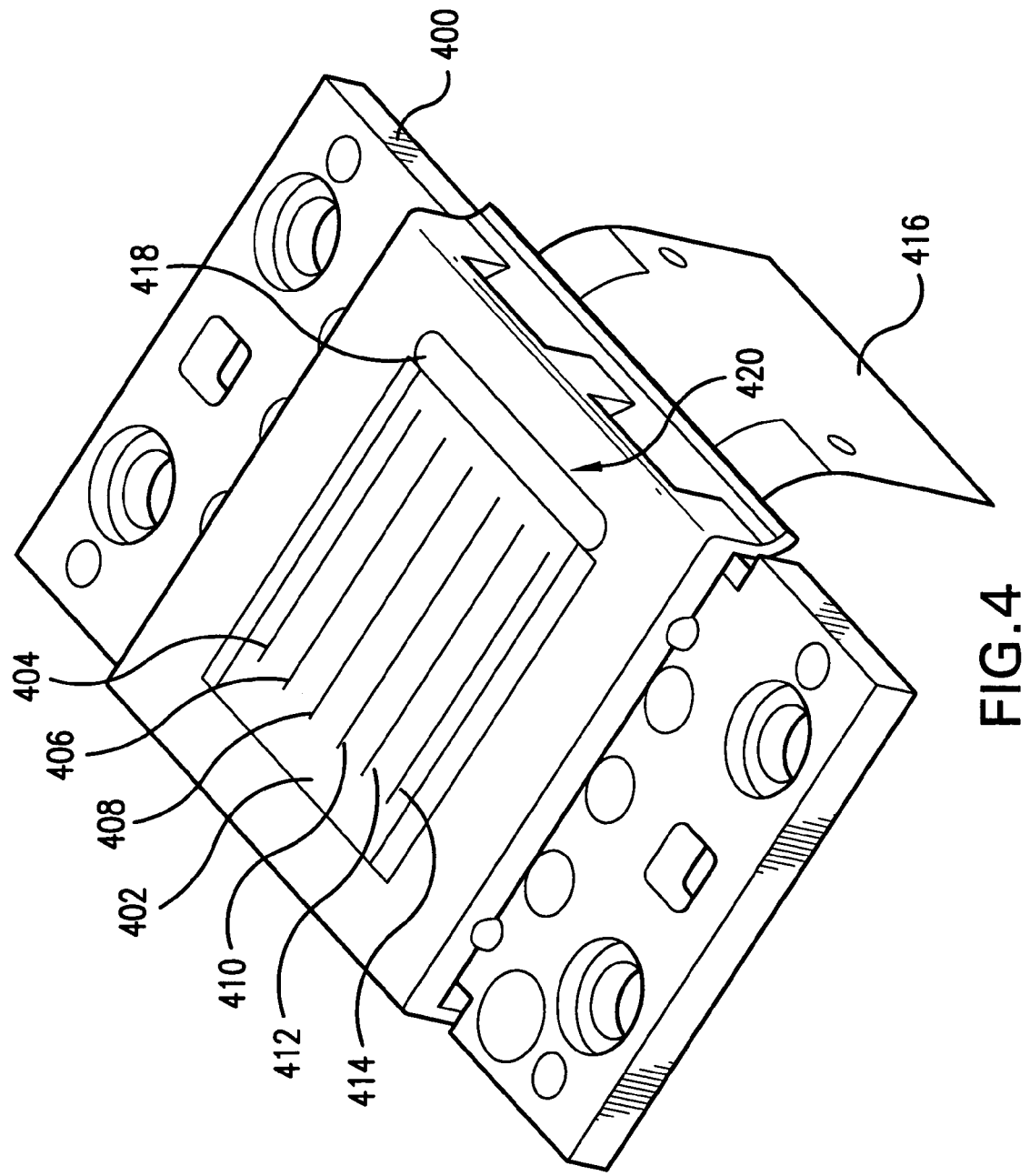
FIG. 4 illustrates a perspective view of an embodiment of a fluid ejection assembly according to one embodiment.

Referring to FIG. 4, a perspective view of an embodiment of a fluid ejection assembly according to one embodiment is illustrated. A substrate carrier 400 includes a substrate 402 including rows of nozzles 404, 406, 408, 410, 412, and 414. Substrate 400 is coupled to a flexible circuit 416 that allows fluid ejection elements and other electronics on substrate 400 to be coupled to external devices, such as a printer, for control and operation. A film 418 is applied to end portion 420 where contacts on substrate 400 are coupled to flexible circuit 416. Film 418 is substantially planar, as depicted, which allows a uniform surface and height from substrate to film. As such, an epoxy below film 418 has a uniform depth from the film to the surface of the substrate.

Figure 5:
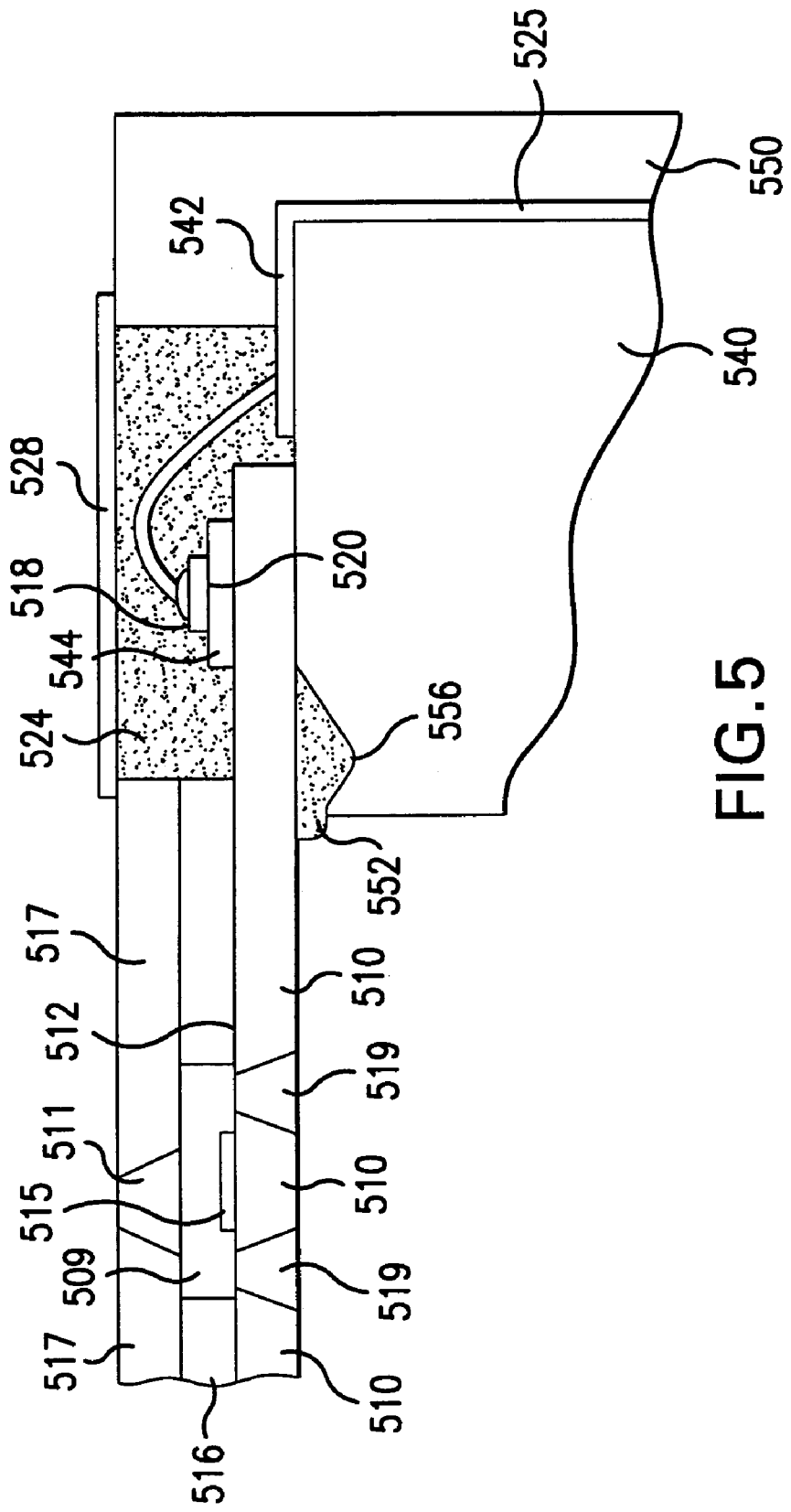
FIG. 5 illustrates a cross-sectional view of a portion of an electronic device according to one embodiment.

Referring to FIG. 5 a cross-sectional view of a portion of an electronic device according to one embodiment is illustrated. In this embodiment, a connection is formed utilizing a wire bond. In this embodiment, electrical traces 525 are formed within fluid ejection body 540 to achieve extra mechanical and environmental protection. Preferably, electrical traces 525 are formed utilizing molded interconnect technology, however other electrical trace routing schemes such as FR-4 board, lead frames, flexible circuits, and combinations of routing schemes can also be utilized. Ultrasonic ball-wedge bonding is preferred, however, other bonding technologies can also be utilized such as thermocompression or thermosonic bonding coupled with wedge-wedge or ball-wedge techniques. In this embodiment, structures, such as a fluid channel layer, substrate 550, and bond pad 550 have substantially the same function as illustrated and described above.

In this embodiment, fluid channels 519 formed in substrate 510 provide a fluidic path to fill fluidic chamber 509. When a fluid ejector 515 is activated, fluid over the fluid ejector 515 is ejected out of nozzles 511. Adhesive 552 is applied to adhesive channel 556 of fluid ejection body 550 forming a fluid seal with substrate 510. To provide mechanical support as well as environmental protection polymer bead 524, such as an epoxy, is dispensed so that dispensed polymer 524 essentially encloses electrical interconnection 520, bond pad 518, and electrical trace end 542. Film 528 is formed over polymer 524 as described. In addition, film 528 may also be formed over electrical conductor 518 and electrical interconnection 520 as described for the embodiments shown in FIGS. 1 and 2. The materials, processes and equipment may be substantially the same as that described above.

Figure 6:
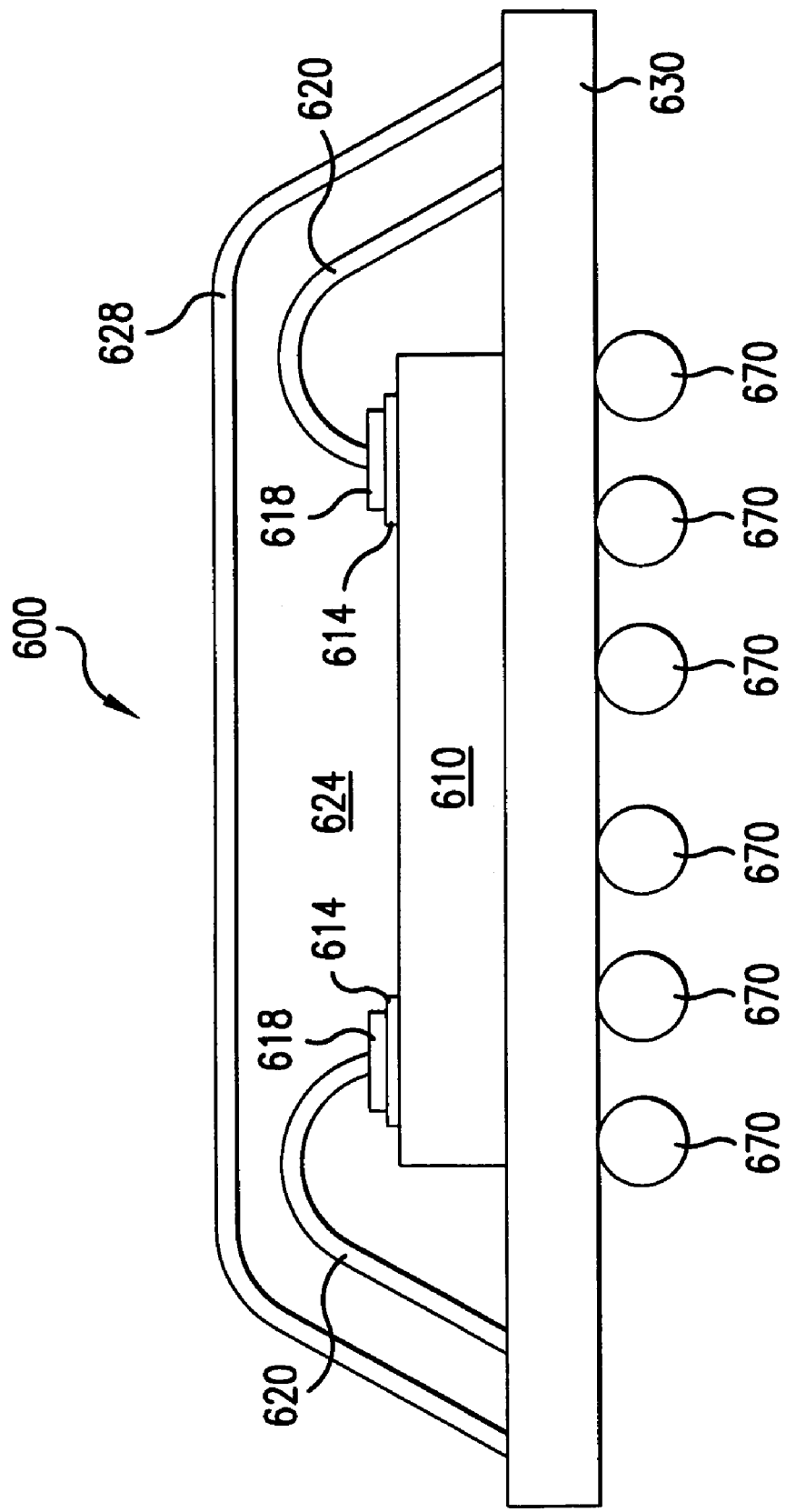
FIG. 6 illustrates a cross-sectional view of a portion of an electronic device according to another embodiment.

Referring to FIG. 6 a cross-sectional view of a portion of an electronic device according to another embodiment is illustrated. In FIG. 6, a simplified cross-sectional view where electronic device 600 includes base film 630 that provides rerouting of electrical interconnection 620 to solder balls 670 forming what is commonly referred to as a ball grid array (BGA). The details of the rerouting structures as well as the electrical connection of electrical interconnection 620 to those structures has been omitted to simplify the drawing. Dielectric layer 614 and bond pads 618 are formed in a manner similar to that described above. In this embodiment electrical interconnection 620, preferably is a wire bond, however other bonding schemes such as conductive adhesives, and anisotropic conductive adhesives can also be utilized. Preferably, base film 630 is a flexible circuit. However, other substrates utilized for electrical trace routing can also be utilized such as FR-4 board or a ceramic die carrier. In addition base film 630 may also be a multi-layered structure providing for an increased number of interconnects while keeping the footprint of the package small. Polymer 624 is an encapsulant, preferably an epoxy; however, other polymers may also be utilized such as polycarbonates, polyimides, and benzocyclobutenes to name a few. Preferably, Polymer 624 is formed utilizing conventional tooling used for molded parts well known in the art of electronic packaging. Film 628 is formed over molded polymer encapsulant 624 as described herein. The materials, processes and equipment may be substantially the same as that described above.

Figure 7A:
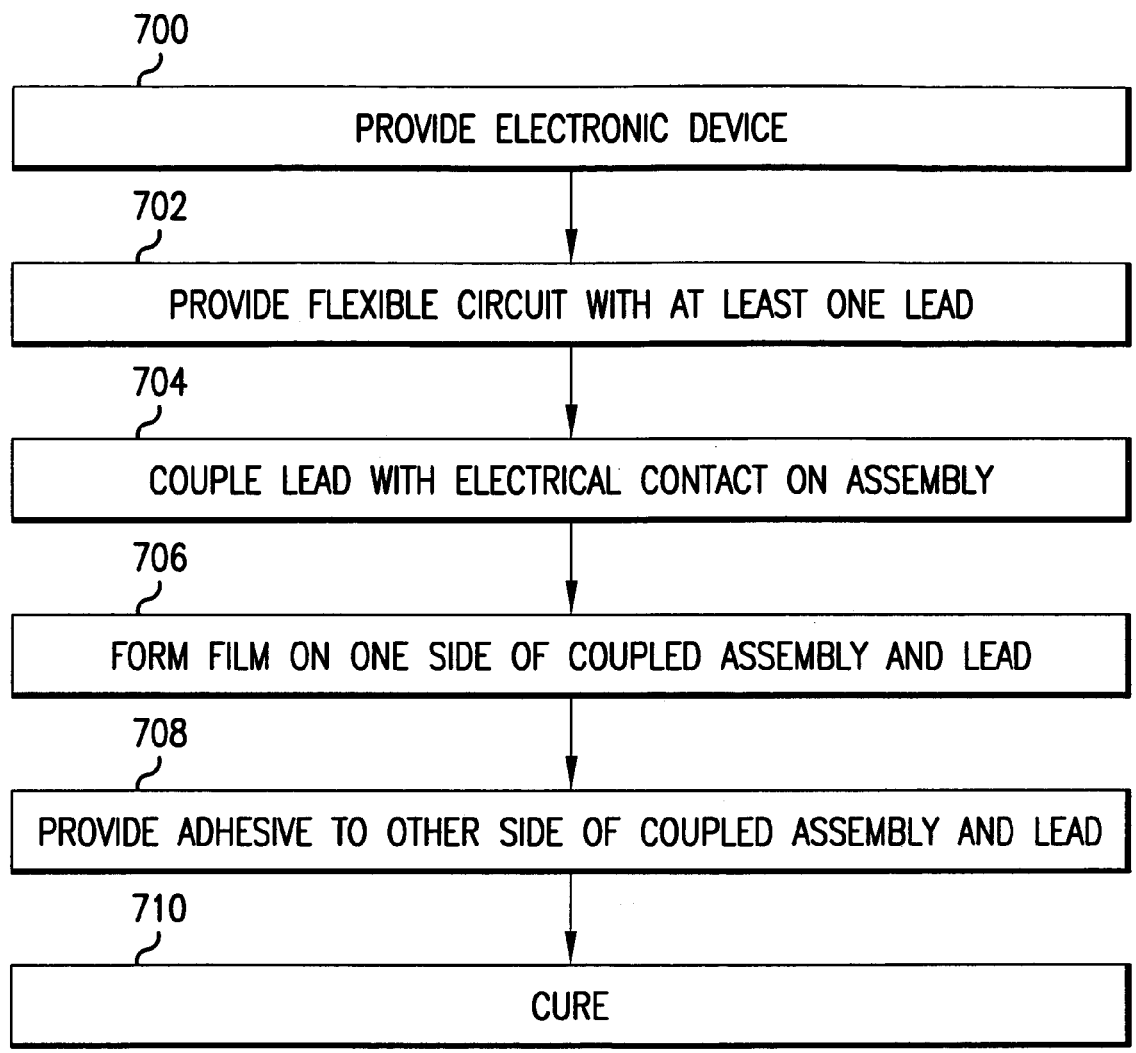
FIGS. 7A-7F illustrate process flow charts for several embodiments of manufacturing processes for assembling an electronic device.

Referring to FIG. 7A, a manufacturing process for assembling an electronic device according to one embodiment is illustrated. An electronic device is provided, step 700. The electronic device includes one or more contacts formed thereon. A lead, from for example a flexible circuit or other structure, is provided in order to form an electrical connection with one or more of the contacts of the electronic device, step 702. The lead is then coupled with one or more of the contacts, step 704. The coupling can occur by connecting the lead and the contact, by using a solder, by using a conductive adhesive or epoxy, by providing an intermediate conductive material, or by any combination of these.

After coupling the lead and the contact, a film is applied to one side of the electronic device overlying the area, step 706. The film is substantially planar and may provide protective properties to protect the coupled lead and contact. The film may be applied, for example, in one embodiment by a heat staking process at for example eighty five degrees centigrade. Other temperatures and structures may be utilized as appropriate.

After the film is applied, a polymer is provided from a side of the electronic device that is not covered by the film, step 708. The polymer may be provided in order to encapsulate and protect the electrical connection between the lead and contact. The structure is cured in order to solidify the polymer. The appropriate method and time for curing is based upon the polymer material utilized.

Figure 7B:
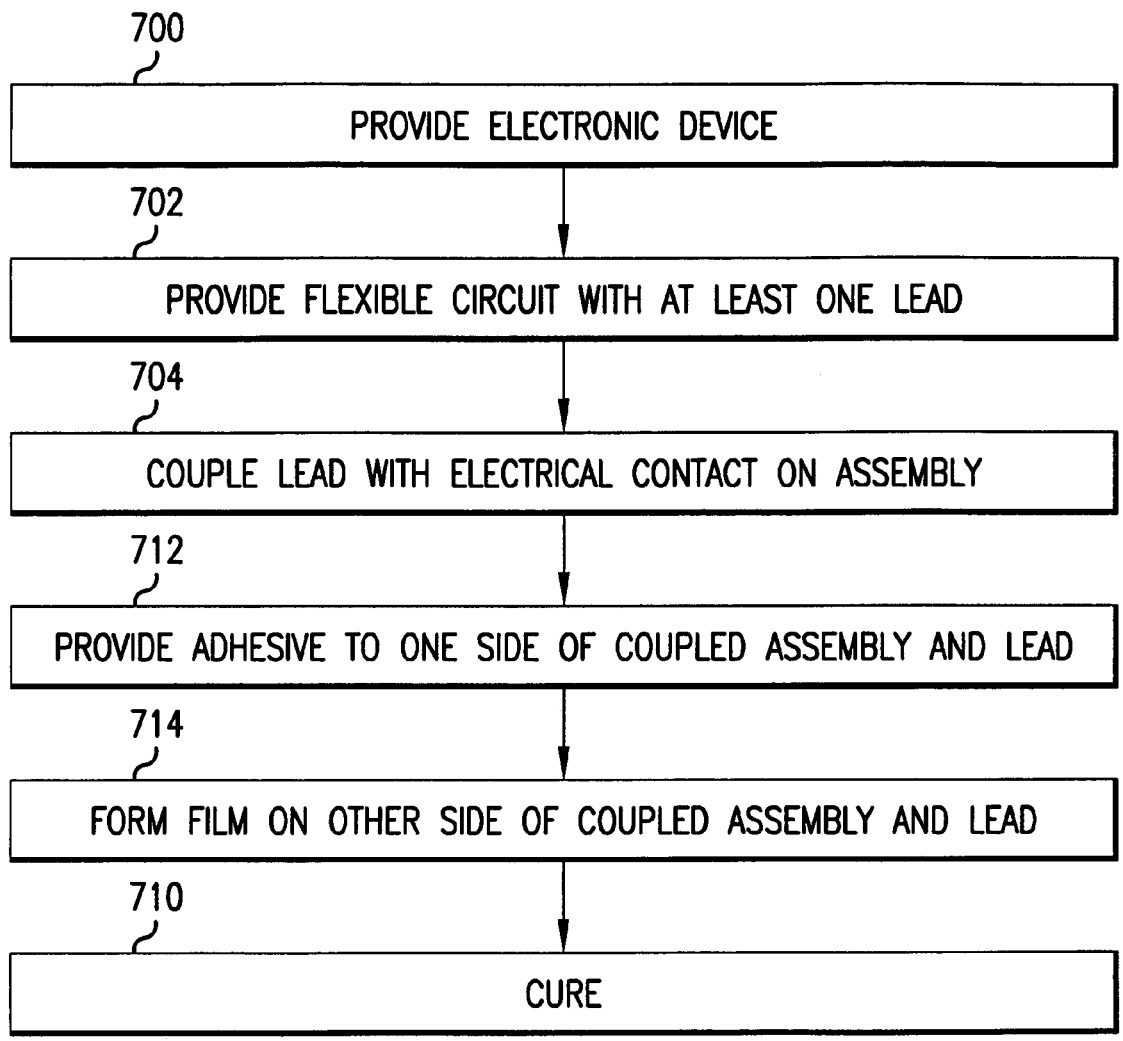

Referring to FIG. 7B, a manufacturing process for assembling an electronic device according to another embodiment is illustrated. The process depicted in FIG. 7B is similar with respect to FIG. 7A, except that polymer is provided, step 712, prior to applying film, step 714.

In FIGS. 7A and 7B, the film utilized may include an adhesive or epoxy on a side that will come in proximity of polymer, so that when curing is occurring, the adhesive or epoxy can reflow in order to promote adhesion between the film and adhesive or epoxy.

Figure 7C:
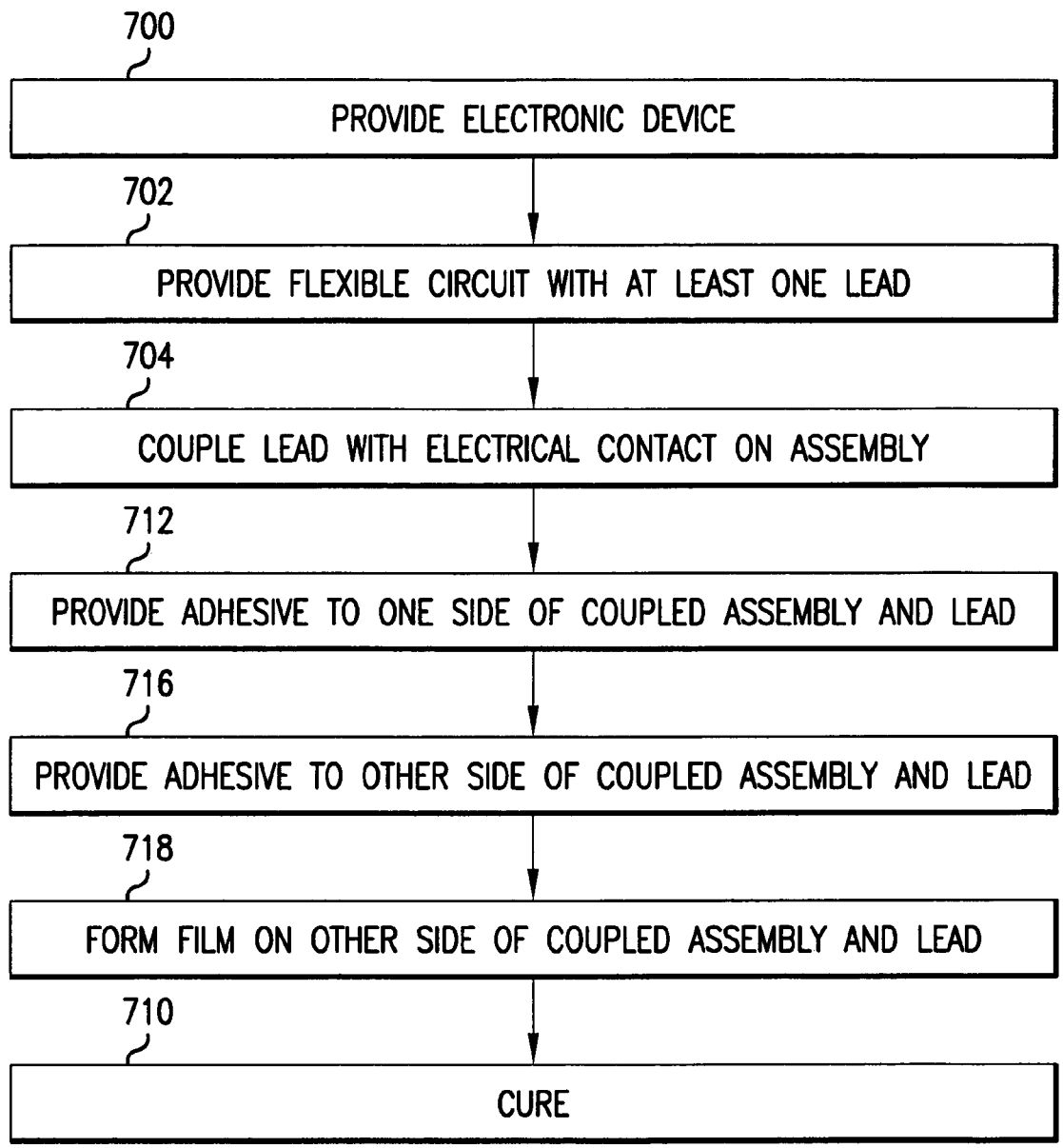

Referring to FIG. 7C, a manufacturing process for assembling an electronic device according to an additional embodiment is illustrated. The process depicted in FIG. 7C is similar with respect to FIG. 7A, except that polymer is provided from two sides of electronic device, steps 712 and 716. Then after this application, a film is applied from one of the sides, step 718. In these embodiments, the side onto which film is being applied generally is provided with less adhesive or epoxy than the side onto which film is not being applied.

Figure 7D:
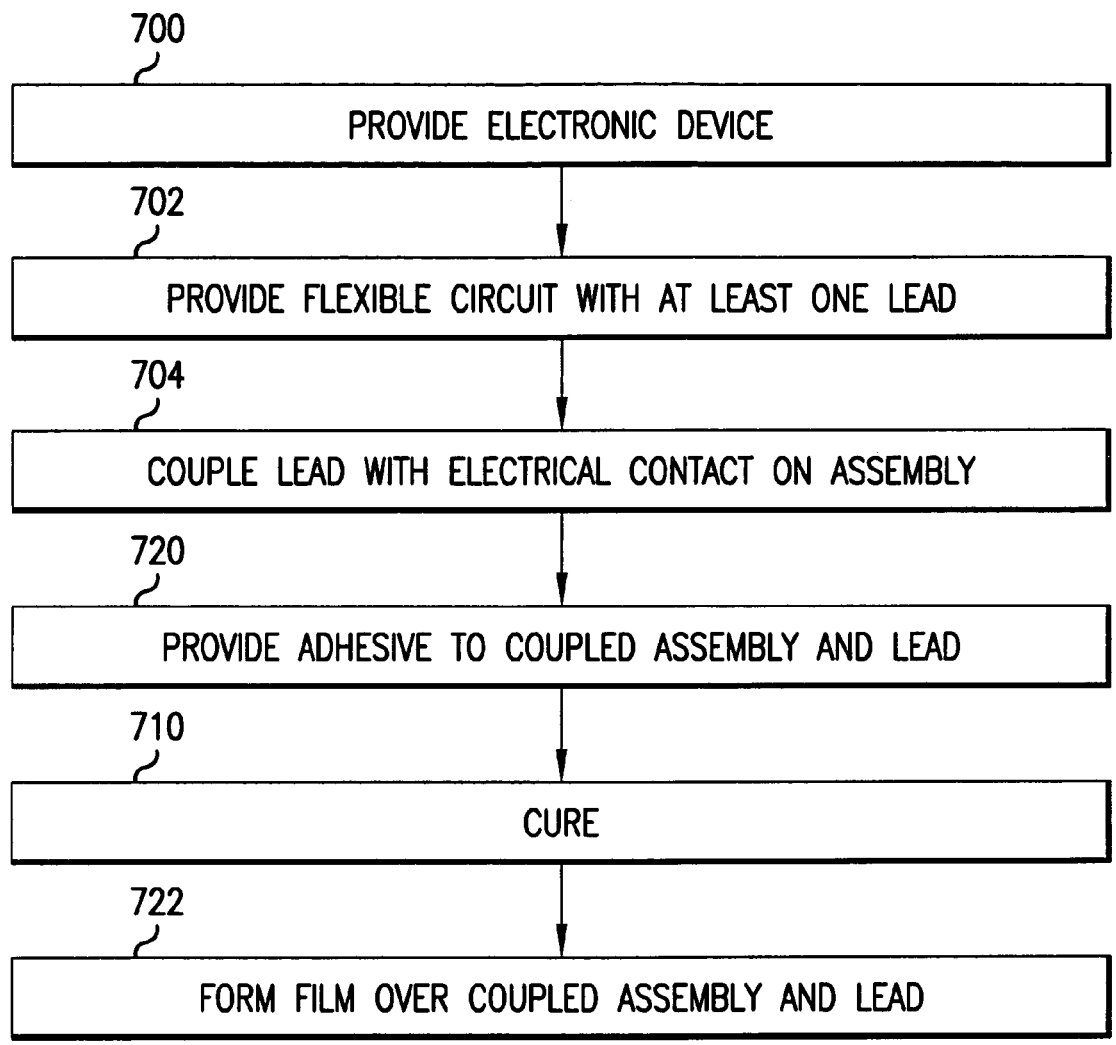

Referring to FIG. 7D, a manufacturing process for assembling an electronic device according to an additional embodiment is illustrated. The process depicted in FIG. 7D is similar with respect to FIG. 7A, except that polymer is provided, step 720 and cured, step 710, prior to providing film, step 722.

Figure 7E:
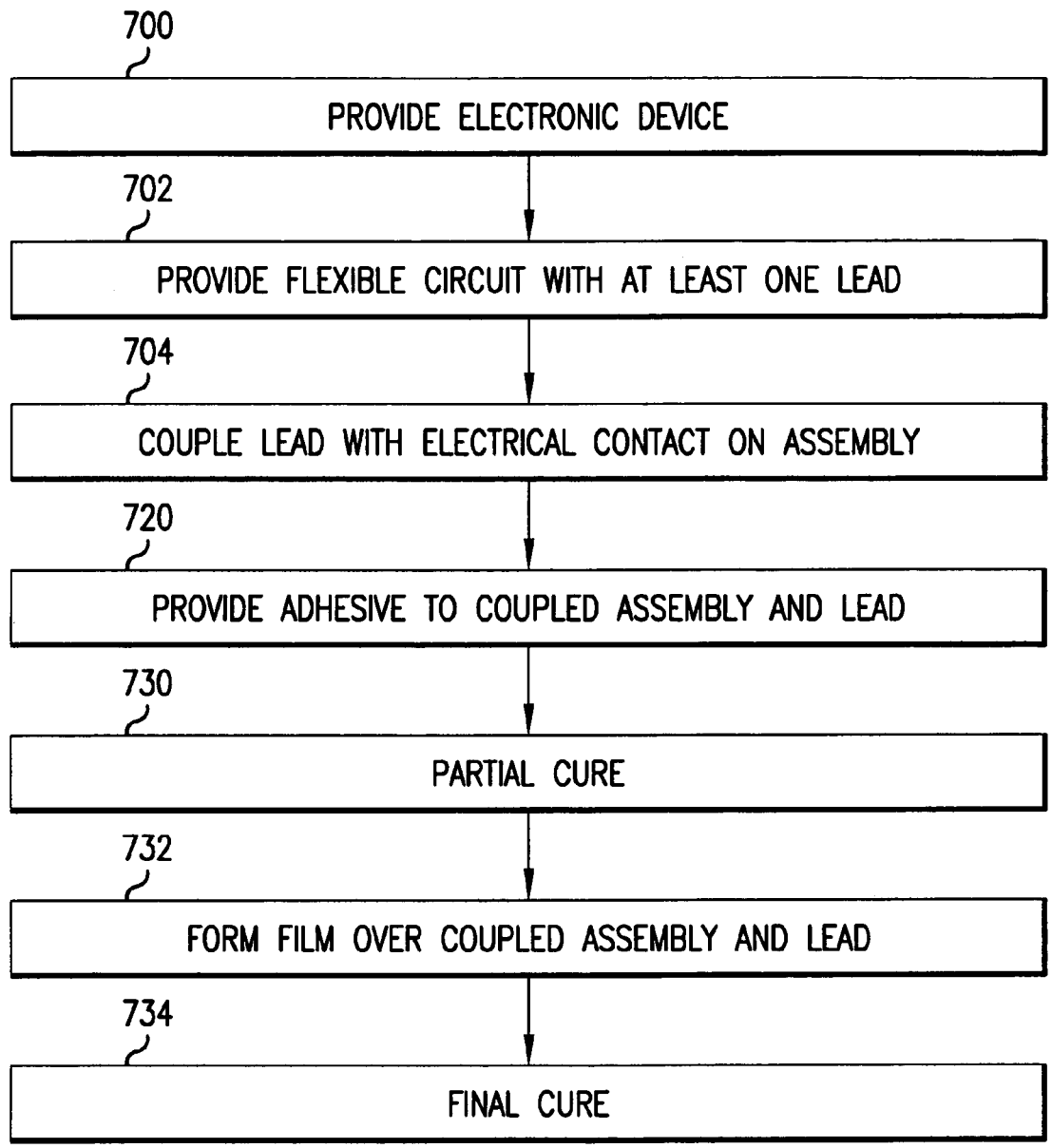

Referring to FIG. 7E, a manufacturing process for assembling an electronic device according to an additional embodiment is illustrated. The process depicted in FIG. 7E is similar with respect to FIG. 7D, except that a curing process 730 prior to film formation 732 is a partial cure of the adhesive and an additional cure process 734 is added after forming film 732.

Figure 7F:
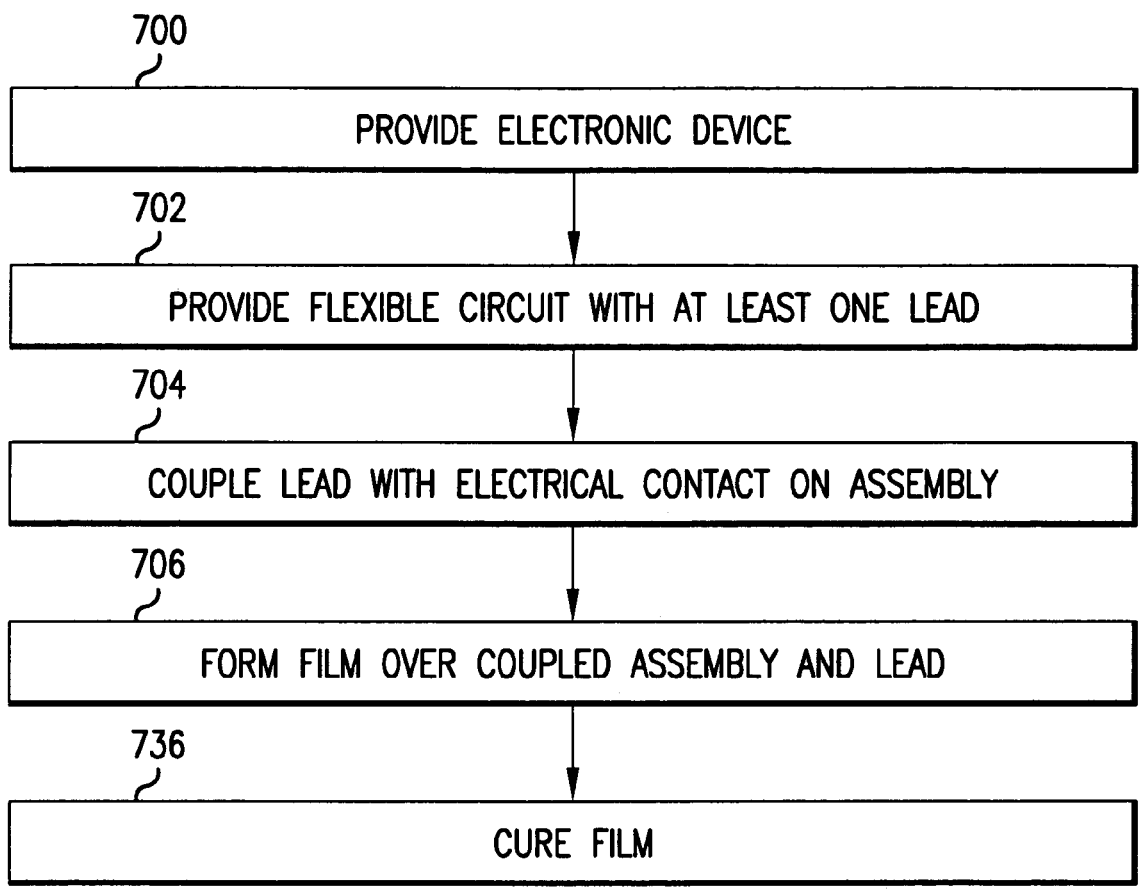

Referring to FIG. 7F, a manufacturing process for assembling an electronic device according to an additional embodiment is illustrated. The process depicted in FIG. 7F is similar with respect to FIG. 7A, except that no polymer is provided and an adhesive coating is applied to a surface of the film.

While FIGS. 7A-7F depict utilizing a contact on the electronic device and a lead from another circuit, or on its own, the electronic device may utilize a lead, wire, hard circuit, or other connector. Further, in order to place and properly align the film to the adhesive a tool may be utilized. The tool, which is appropriately shaped for the film and substrate, can be utilized to press a film that is laid down to a level of an adjacent component of the electronic device. In the case of a fluid ejection device, the component may be base film 230.

Figure 8:
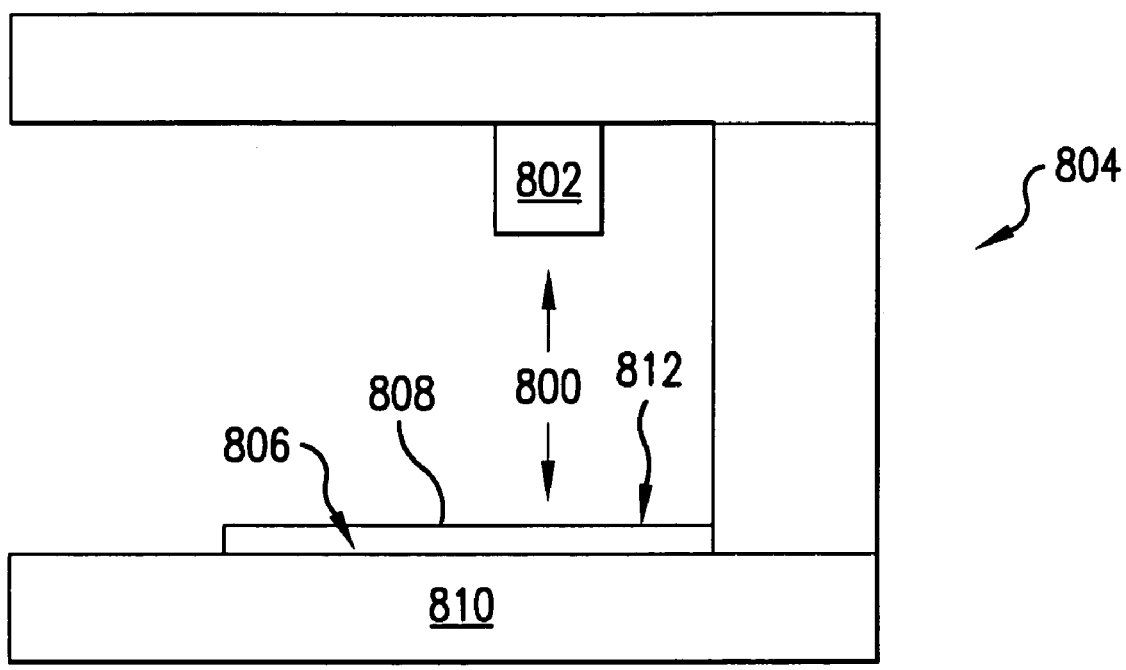
FIG. 8 illustrates a side view of a fluid ejection system according to one embodiment.

Referring to FIG. 8, a side view of a fluid ejection system according to one embodiment is illustrated. A distance 800 between fluid ejection assembly 802 of a fluid ejection system 804 and a bottom surface 806 of a media 808 define a pen-to-paper spacing (PPS). In some embodiments media 808 is supported by a platen 810. When fluid ejection device ejects ink, or other fluid, it is provided onto a print zone area.

The PPS and the thickness of the media 808 determine the distance 800 between fluid ejection assembly 802 and an upper surface 812 of the media 808. Maintaining a suitable distance between the fluid ejection assembly 802 and the upper surface 812 is important to achieve the best image quality possible.

Normally, when the printer is manufactured, the PPS is set and fixed at a nominal value based upon a default medium having a default thickness. Nevertheless, the distance between the fluid ejection assembly 802 and the upper surface 812 of the media 808 may vary due to manufacturing issues, such as use of a substantially non-planar polymer to encapsulate leads. This results in having to design the PPS above desired design tolerances, and may result in nozzle PPS levels that vary from printer to printer, which may affect printing quality and increase manufacturing costs. By using a substantially planar film, as described herein, the PPS can be precisely designed and manufactured from printer to printer, thereby improving print quality and improving manufacturing yields.

Although the inventive concepts have been described in language specific to structural features and methodological steps, it is to be understood that the appended claims are not limited to the specific features or steps described. Rather, the specific features and steps are disclosed as preferred forms of implementing the inventive concepts.

What is claimed is:

1. An electronic device comprising:
   a substrate;
   an electrical contact disposed on the substrate;
   a lead electrically coupled to the electrical contact;
   a polymer enclosing the electrical contact; and
   a first film disposed over the electrical contact and in contact with the polymer;
   a second film disposed over the first film.

2. The electronic device of claim 1 wherein the first film comprises a barrier layer.

3. The electronic device of claim 2 wherein the barrier layer is selected from a group consisting of silicon oxide, aluminum oxide, silicon oxide, sol gel, or a polymer.

4. The electronic device of claim 2 wherein the barrier layer has a thickness of between approximately 50 angstroms and 50 microns.

5. The electronic device of claim 1 wherein the second film has a thickness of between approximately 5 microns and 500 microns.

6. The electronic device of claim 1 wherein the second film is selected from a group consisting of polyester, polyimide, polyolefin, and polynaphthalate, 7. The electronic device of claim 1 wherein the second film is multilayer-structure.

8. The method of claim 7 wherein layers of the multilayer-structure are selected from a group consisting of polymers, glass, ceramic, and metal.

9. The electronic device of claim 8 wherein the polymer is a layer of adhesive attached to the first film.

10. The electronic device of claim 8 wherein the polymer is one of a paste adhesive or an epoxy.

11. The electronic device of claim 1 wherein the polymer is one of a paste adhesive or an epoxy.

12. The electronic device of claim 1 wherein the lead is a wire.

13. The electronic device of claim 1 wherein the first and second film are substantially planar.

14. The electronic device of claim 1 wherein the substrate is a fluid ejection device.

15. The electronic device of claim 1 wherein the lead is coupled with a flexible circuit.

16. The electronic device of claim 1 wherein the lead is coupled with a rigid circuit.

17. The electronic device of claim 1, wherein the second film is not in contact with the polymer.

18. An electronic device, comprising:
   a substrate;
   an electrical contact disposed on the substrate;
   a lead electrically coupled to the electrical contact;
   a polymer enclosing the electrical contact;
   a substantially planar film disposed over the electrical contact and polymer and covering the polymer; and
   a baffler layer disposed between the substantially planar film and the polymer.

19. The electronic device of claim 18 wherein the barrier is selected from a group consisting of silicon oxide, aluminum oxide, flexible silicon oxide (SiOx), sol gel, and a polymer.

20. The electronic device of claim 18 wherein the barrier layer has a thickness of between approximately 50 angstroms and 50 microns.

21. An electronic device comprising:
   a substrate including at least one resistor disposed thereon, a dielectric layer disposed over at least a portion of the substrate, and an electrical conmet in contact with the dielectric layer and electrically coupled with the at least one resistor;
   a substrate carrier including an electrical trace electrically coupled to the electrical contact;
   a polymer enclosing the electrical contact; a substantially planar film disposed over the electrical contact and polymer and covering all of the polymer; and
   a harder layer disposed between the substantially planar film and the polymer.

22. The electronic device of claim 21 wherein the harrier is selected from a group consisting of silicon oxide, aluminum oxide, sol gel, or a polymer.

23. The electronic device of claim 21 wherein the barrier layer has a thickness of between approximately 50 angstroms and 50 microns.

24. A method of forming a contact comprising:
   providing a substrate including an electrical contact:
   providing a lead;
   coupling at least part of the lead with the electrical contact;

encapsulating at least a portion of the lead and electrical contact that have been coupled;

applying a substantially planar film over the substrate so that at least a portion of the lead and electrical contact where coupled is covered by the film; and applying a second film over the substantially planar film.

25. The method of claim 24 wherein the substantially planar film includes an adhesive coating applied to a surface thereof.

* * * * *

UNITED STATES PATENT AND TRADEMARK OFFICE
CERTIFICATE OF CORRECTION

PATENT NO. : 7,475,964 B2 Page 1 of 1
APPLICATION NO. : 10/913101
DATED : January 13, 2009
INVENTOR(S) : Brad Benson et al.

It is certified that error appears in the above-identified patent and that said Letters Patent is hereby corrected as shown below:

In column 10, line 6, in Claim 6, delete "polynaphthalate," and insert -- polynaphthalate. --, therefor.

In column 10, line 9, in Claim 8, delete "method" and insert -- electronic device --, therefor.

In column 10, line 37, in Claim 18, delete "baffler" and insert -- barrier --, therefor.

In column 10, line 48, in Claim 21, delete "conmet" and insert -- contact --, therefor.

In column 10, line 56, in Claim 21, delete "harder" and insert -- barrier --, therefor.

In column 10, line 58, in Claim 22, delete "harrier" and insert -- barrier --, therefor.

In column 10, line 65, in Claim 24, delete "contact:" and insert -- contact; --, therefor.

Signed and Sealed this

Twelfth Day of May, 2009

JOHN DOLL
*Acting Director of the United States Patent and Trademark Office*